United States Patent [19]
Ishizuka et al.

[11] Patent Number: 4,917,758
[45] Date of Patent: Apr. 17, 1990

[54] METHOD FOR PREPARING THIN COPPER FOIL-CLAD SUBSTRATE FOR CIRCUIT BOARDS

[75] Inventors: Koichi Ishizuka; Morio Gaku; Kenzi Ishii; Hidenori Kinbara; Masakazu Motegi, all of Tokyo, Japan

[73] Assignee: Mitsubishi Gas Chemical Company, Inc., Tokyo, Japan

[21] Appl. No.: 354,954

[22] Filed: May 19, 1989

[30] Foreign Application Priority Data

| May 20, 1988 | [JP] | Japan | 63-122050 |
| Jul. 12, 1988 | [JP] | Japan | 63-171734 |
| Jul. 12, 1988 | [JP] | Japan | 63-171735 |
| Jul. 14, 1988 | [JP] | Japan | 63-173743 |
| Jul. 14, 1988 | [JP] | Japan | 63-173744 |
| Aug. 26, 1988 | [JP] | Japan | 63-210490 |
| Dec. 21, 1988 | [JP] | Japan | 63-320453 |

[51] Int. Cl.$^4$ .............. C23F 1/00; B44C 1/22; C03C 15/00; C03C 25/06
[52] U.S. Cl. .................. 156/630; 156/640; 156/645; 156/651; 156/656; 156/666; 156/902; 252/79.2
[58] Field of Search ............ 156/630, 640, 645, 651, 156/656, 666, 902; 252/79.2

[56] References Cited

U.S. PATENT DOCUMENTS

| 3,231,503 | 1/1966 | Laue | 156/666 X |
| 3,671,407 | 6/1972 | Hamiton et al. | 156/666 X |
| 4,434,022 | 2/1984 | Kamada et al. | 156/666 X |
| 4,790,902 | 12/1988 | Wada et al. | 156/666 X |

Primary Examiner—William A. Powell
Attorney, Agent, or Firm—Sughrue, Mion, Zinn, Macpeak & Seas

[57] ABSTRACT

A method for preparing a thin copper foil-clad substrate for the manufacture therefrom of circuit boards, which comprises subjecting a copper foil-clad circuit board substrate comprising an electrically insulating support having provided on one or both sides thereof a copper foil having an average thickness of 12 μm or more to etching with an etching solution for copper, the etching being performed such that the whole surface of the copper foil is etched at a predetermined etching rate selected from the range of from 0.01 to 0.3 μm/sec, thereby to reduce the thickness of the copper foil on at least one side of the insulating support to 10 to 80% of its original thickness, and the variation of the thickness of the copper foil remaining after the etching is within ±2.0 μm on the basis of a desired thickness.

16 Claims, No Drawings

METHOD FOR PREPARING THIN COPPER FOIL-CLAD SUBSTRATE FOR CIRCUIT BOARDS

FIELD OF THE INVENTION

This invention relates to a method for preparing thin copper foil-clad substrate for the manufacture therefrom of printed circuit boards on which electronic parts are to be mounted. The thin copper foil-clad substrate prepared by the method of the present invention comprises an electrically insulating support and a thin copper foil having an average thickness of a few μm to 20 μm, particularly from 3 μm to 12 μm, and a thickness variation within ±2.0 μm, particularly ±1.0 μm, on the basis of a desired thickness, and includes such copper foil-clad circuit board substrates as a copper foil-clad laminate, a copper-clad film and a copper-clad sheet, and reinforced copper foils.

BACKGROUND OF THE INVENTION

Copper foil-clad circuit board substrates are usually produced by lamination molding in which a copper foil is superimposed on an insulating support and they are molded together. As such copper foils, 105 μm, 70 μm, 35 μm, 18 μm and 12 μm thick copper foils and the like are mass-produced by the electrolytic process, and those formed on a support such as an aluminum foil and having a thickness of 5 μm, 9 μm, etc. are also produced. Further, there are copper foils produced by the rolling process, but those having thicknesses of 35 μm or less have not yet been commercially available, since the smaller the thickness, the higher the costs of such copper foils, because of its production method.

In the case where the copper foil used in lamination molding is too thin, extreme difficulties are encountered in superimposing the copper foil on an insulating support because such a copper foil is prone to become wrinkled, and also in that the wrinkles occur by the lamination molding after superimposing. The copper foil formed on a support such as an aluminum foil may eliminate this problem, but this copper foil has disadvantages that it costs too much and use of this copper foil necessitates the step of peeling the support such as an aluminum foil from the copper foil before a printed circuit is formed.

Therefore, there has actually been not easy to mass-produce a double-side copper-clad substrate having different thicknesses of two copper foils, such as a double-side copper-clad substrate having provided on one side thereof a thin copper foil prepared by the electrolytic process or a copper foil having a thickness of less than 20 μm prepared by the rolling process, and having provided on the other side thereof a copper foil having a thickness of, for example, 20 μm to 105 μm.

On the other hand, there has been a known method in which a copper foil-clad circuit board substrate is subjected to preliminary etching with an etching liquid containing copper chloride, iron chloride, etc. in the processing of printed circuit board substrates, to remove a thin surface layer of the copper foil, and the resulting copper foil is used in the manufacture of printed circuit boards. However, in the case where the thickness of the surface layer of the copper foil removed in the preliminary etching exceeds a few microns, or where a copper-clad substrate having a size as large as 500×500 mm or larger is subjected to etching, the thickness variation of the resulting etched copper foil becomes too large, and hence this method has been regarded as disadvantageous in that it cannot produce thin copper foil-clad circuit board substrates which can be practically used.

For example, JP-A No. 62-200796 discloses a method in which a circuit board substrate overlaid with a copper foil having an average thickness of 18 μm or more is subjected to mechanical abrasion, electrochemical polishing or chemical etching to reduce the thickness of the copper foil to 12 μm or less, thereby to prepare an extremely thin copper foil-clad circuit board substrate. (The term "JP-A" as used herein means an "unexamined published Japanese patent application".) In Example 1 of the specification of this prior art reference, there is a description to the effect that a copper foil-clad circuit board substrate having a size of 340×340 mm and an average copper foil thickness of 18 μm was subjected to etching with an etching liquid comprising cupric chloride and hydrochloric acid to etch the whole surface of the copper foil, thereby obtaining a thin copper foil-clad circuit board substrate having an average copper foil thickness of 10 μm.

However, this method has the following disadvantages The present inventors reproduced this method, as. will be described in Comparative Example 1 described hereinafter, by the use of a conventional spray-type etching process, and found that at the time when only 5 copper-clad laminates had been subjected to etching to remove the surface layers of the copper foils by 6 μm on an average, the thickness variation on the basis of an average thickness was ±3.5 μm and that on the basis of a desired thickness was ±4.8 μm, these variations being almost equal to the thickness removed by the etching. This tendency became strong with the increase in the thickness removed by etching or in the number of products produced. Hence, the above method cannot produce extremely thin copper foil-clad circuit board substrates which have a thickness variation sufficiently low for commercialization. Further, other methods disclosed in this prior art reference, including mechanical abrasion and electropolishing, gave similar results, showing difficult commercialization of this process. Moreover, in the case where the whole surface of a copper foil was etched with a usual etching liquid to prepare a thin copper-clad circuit board substrate, as described in Example 1 of this prior art reference, the resulting surface of the remaining copper foil was highly active and, hence, corroded in a short time in the atmosphere, although there is no problem if the substrate obtained is immediately used in the manufacture of circuits therefrom.

Furthermore, it has been extremely difficult to uniformly etch the surfaces of the copper foils of single-side copper-clad laminates having a thickness of 0.3 mm or less, because such laminates suffer from deformation due to curling etc.

SUMMARY OF THE INVENTION

The present inventors have conducted intensive studies on the development of a method which can produce, at a high efficiency, thin copper foil-clad circuit board substrates usable as large-size circuit board substrates. As a result, they have found that thin copper foil-clad circuit board substrates with satisfactorily small thickness variations can be obtained by etching the whole surface of the copper foil of a copper-clad circuit board substrate at an extremely low etching rate as compared with the conventional etching processes. The present invention is based on this novel finding.

Accordingly, an object of this invention is to provide a method for preparing a thin copper foil-clad substrate for the manufacture therefrom of circuit boards, by which method a thin copper foil-clad circuit board substrate having an extremely low variation in the foil thickness can be easily obtained at low cost.

DETAILED DESCRIPTION OF THE INVENTION

According to the present invention, there is provided a method for preparing a thin copper foil-clad substrate for the manufacture therefrom of circuit boards, which comprises subjecting a copper foil-clad circuit board substrate comprising an electrically insulating support having provided on one or both sides thereof a copper foil having an average thickness of 12 μm or more to etching with an etching solution for copper, the etching being performed such that the whole surface of the copper foil is etched at a predetermined etching rate selected from the range of from 0.01 to 0.3 μm/sec, thereby to reduce the thickness of the copper foil on at least one side of the insulating support to 10 to 80% of its original thickness, and that the variation of the thickness of the copper foil remaining after the etching is within ±2.0 μm on the basis of a desired thickness.

According to preferred embodiments of this invention, the variation of the thickness of the copper foil remaining after etching is within ±1.0 μm on the basis of a desired thickness; the etching solution for copper is an aqueous solution containing 1.5 to 4 w/v % hydrogen peroxide, 3 to 7 w/v % sulfuric acid, and 10 to 60 g/l copper, the concentration of hydrogen peroxide and sulfuric acid being each regulated within ±0.3 w/v % on the basis of a predetermined concentration, and the etching is performed at a temperature of from 25° to 50° C., the temperature being regulated within ±1.0° C. on the basis of a predetermined temperature; the etching solution for copper further contains 0.1 to 5 w/v % alcohol as an auxiliary; and the etching solution for copper is an aqueous solution containing 0.25 to 3 mol/l cupric chloride and 1 to 4 mol/l hydrogen chloride, at least the concentration of hydrogen chloride being regulated within ±0.3 mol/l on the basis of a predetermined concentration, and the etching is performed at a temperature of from 25° to 55° C., the temperature being regulated within ±5.0° C. on the basis of a predetermined temperature.

According to other preferred embodiments of this invention, the surface of the copper foil remaining after the etching is cleaned, and then covered with an anti-corrosive agent or a strippable resin coating, thereby protecting the copper surface; and the cleaning is performed by treating, immediately after the etching, the surface of the remaining copper foil with a water-soluble anti-corrosive agent, or the strippable resin coating is a photoresist.

According to further embodiments, the copper foil-clad circuit board substrate to be etched is a double-side copper foil-clad circuit board substrate, and the etching is performed such that the thickness of the copper foil on at least one side of the insulating support is reduced to 3 to 15 μm, thereby to prepare a double-side thin foil-clad circuit board substrate in which each side of the insulating support has a copper foil adhered thereto, the two copper foils having different thicknesses; and the etching of the double-side copper foil-clad circuit board substrate is performed by means of a spray-type etching machine equipped with spray nozzles for spraying an etching solution positioned on each side of the double-side copper foil-clad circuit board substrate, the number of the spray nozzles on one side of the substrate being different from that for the other side.

According to still further embodiment, the copper foil-clad circuit board substrate is a double-side copper foil-clad circuit board substrate, and the etching is performed such that the thickness of the copper foil on one side of the insulating support is reduced to 3 to 15 μm and the copper foil on the other side is completely removed.

According to still further embodiments, the copper foil-clad circuit board substrate is a combined substrate prepared by provisionally bonding two single-side copper-clad circuit board substrates with each other through a releasable plastic film, thereby to unite the two substrates; the single-side copper-clad circuit board substrates of this combined substrate each has thicknesses of 0.3 mm or less; the combined substrate is an edge-bonded combined substrate in which the edge thereof has been partly or wholly bonded; and the edge-bonded combined substrate is prepared by forming a combined substrate by the use of a release film or sheet of a predetermined area size smaller than the prepreg, a film or sheet having a releasable part of a predetermined area size, or a releasable film or sheet having many perforations in the part corresponding to the edge of the edge-bonded combined substrate to be formed, and then cutting the thus-formed combined substrate into a predetermined size.

The present invention will be explained below with respect to its constitution.

[Copper-Clad Substrate]

As the copper foil-clad circuit board substrate used in this invention, comprising an electrically insulating support having provided on one or both sides thereof a copper foil, any commercially available copper-clad substrates which are used as materials for electrical products can be used. In this invention, however, generally preferred is the substrate with a copper foil having a nominal thickness of 12 μm or more, and particularly preferred is the substrate with a copper foil having an average thickness between 12 to 18 μm and a thickness variation on the basis of an average thickness within ±1.0 μm. Examples of the copper-clad circuit board substrate include a single-side or double-side copper-clad film, a sheet, a fiber-reinforced insulating resin laminate, a metal-core laminate, a combined substrate and a multi-layer shield substrate having an inner-layer printed circuit.

Examples of the electrically insulating support in such copper foil-clad circuit board substrate include a film or sheet made of polyimide, a polyester resin or the like; a material prepared using a prepreg which is a combination of a matrix resin such as a thermosetting resin, a heat-resistant thermoplastic resin, etc., and a base material which is a reinforcing material in the form of a porous film or sheet prepared from fibers, a chopped material or the like made of one or a suitable combination of two or more of glasses [E-glass, D-glass, S-glass, silica glass (quartz), etc.], ceramics (alumina, boron nitride, etc.), a totally-aromatic polyamide (aramide, etc.), polyimide, semi-carbon, a fluororesin, and other heat-resistant engineering plastics, etc.; or a material prepared by covering an iron or aluminum plate or the like with an adhesive or adhesive film having insulating properties.

Copper-clad laminates which are commercially available usually have undulating copper foil surfaces, caused by the pressure applied during lamination molding, which reflect part of the surface roughness of the base materials and which, in the case of a woven base material of glass, has an undulation height of about 3 to 4 μm, with a pitch being about 0.4 mm. This undulation may be mechanically converted into fine roughness or eliminated before such a copper-clad laminate is used in this invention.

For preparing a copper-clad laminate or sheet using a 12 to 18 μm thin copper foil, a preferred method is to superimpose between the copper foil and a mirror plate a sheet of aluminum etc. having a thickness of about 40 to 100 μm and a thermal expansion coefficient larger than that of the copper foil.

A release film or sheet (hereinafter referred simply to as "release sheet") used in the preparation of the above-described combined substrate (product of provisional bonding of two single-side copper-clad laminates through a release sheet) is a film or sheet made of plastic, metal, etc. from which a cured prepreg can be easily released even after lamination molding in which a prepreg and a copper foil are superimposed on each side of the film or sheet and the resulting assembly is molded to cure the resin Examples of the release sheet include a film of plastic such as cellulose triacetate, polypropylene, poly-4-methylpentene-1, polyethylene terephthalate, polyvinylidene fluoride, polytetrafluoroethylene, etc.; a film or sheet of metal such as stainless steel, aluminum or brass, or a film or sheet of such metal on which a releasing agent has been applied; and a metal film or sheet overlaid with a plastic layer having releasing properties.

The thickness of the release sheet is usually selected from the range of from 10 to 300 μm. In the case where a single-side thin copper foil clad laminate obtained is used as a lamina for preparing a combined substrate, preferably employed is a sheet which has been undergone surface-roughening treatment (matting treatment) in order to improve its adhesive properties.

In practicing this invention using a combined substrate, it is preferred that the combined substrate be such that the edge thereof has been bonded (hereinafter referred to as "edge-bonded combined substrate"), from the standpoint of prevention of troubles such as soiling of the back side (the surface in contact with the release sheet) by an etching solution. For preparing the edge-bonded combined substrate, the above-described release sheet is processed before being used in lamination molding so that even after the thus-prepared edge-bonded combined substrate has been cut into a predetermined size, the resulting edge will be partly or wholly in its bonded state. For example, the following methods may be employed a method which comprises providing release sheets having a predetermined area size smaller than the size of prepregs, superimposing one or more of the release sheets between two prepregs, with the release sheet or sheet being placed in a predetermined position or positions, the sheets being placed such that they are not overlapped or that one sheet is superposed on another, to form an assembly composed of [copper foil/prepreg/release sheet/prepreg/copper foil], and then lamination-molding the assembly between mirror plates; a method which comprises providing release sheets having almost the same size as that of prepregs, each sheet having one or plural release part(s) on one or both sides in the same positions, forming an assembly composed of [copper foil/prepreg/release sheet/prepreg/copper foil] by the use of one release sheet or by the use of two release sheets with one sheet being superposed on another, and then lamination-molding the assembly between mirror plates; and a method which comprises providing perforated release sheets having almost the same size as that of prepregs and having many perforations on the part corresponding to the edge of the combined substrate to be formed, forming an assembly composed of [copper foil/prepreg/release sheet/prepreg/copper foil] by the use of one release sheet or by the use of two release sheets with one sheet being superposed on another, and then lamination-molding the assembly between mirror plates.

In the last method above, the width of the adhesive part corresponding to the edge of the combined substrate need not be made particularly large so long as the positioning in cutting operation is easy, and is generally selected from the range of from about 2 to 20 mm.

Further, the positions of the perforations should be such that the perforations are uniformly scattered over the part corresponding to the edge of the combined substrate to be formed and that the perforations do not make the handling of the release sheet difficult. For example, the shape of each perforation is generally selected from a circle, ellipse, convex polygon, concave polygon, etc. each having a diameter of about 2 to 10 mm, and such perforations are suitably positioned in a row or rows, at a pitch of about 2 to 30 mm. After a combined substrate is prepared, the positions of the release sheets therein can be easily found by a measuring procedure etc., because the original positions of the release sheets etc. are hardly shifted through the lamination molding if the release sheets used have almost the same size as that of the prepregs. However, it is preferred that perforations of the kind described above, or marking holes or other markings be formed in the release sheet beforehand in the area corresponding to the edge of the combined substrate.

In the case where release sheets smaller than prepregs were used to prepare a combined substrate, it is convenient to visually judge the positions of the release sheets in the product from the difference in level between the area under which the release sheet is present and the area with no release sheet, and from others. In this case, it is preferred to employ a release sheet having a thickness of 50 μm or more, particularly about 100 μm, because it makes the visual judgment easy.

The thickness of the single-side copper-clad laminate of the thus-prepared combined substrate is not especially limited, but is generally from about 0.03 mm to 0.3 mm. Such a single-side copper-clad laminate having a thickness of 0.3 mm or thinner particularly tends to curl, if used alone, due to the difference in thermal expansion coefficient between the copper foil and the insulating layer, leading to difficulties in etching the laminate by means of a usual etching machine. However, if such a single-side copper-clad laminate is combined with another laminate to give a combined substrate, such curling problem can be completely eliminated, and hence single-side copper-clad thin laminates are advantageously formed into combined substrates.

[Etching Solution for Copper]

The etching solution for copper used in this invention is an aqueous solution containing, as main etching agents, hydrogen peroxide/sulfuric acid, copper chloride, a persulfate or iron chloride. The etching rate is kept low in this invention by keeping the concentrations of the etching agents low as compared with those in usually employed etching solutions, by keeping the etching temperature low, or by reducing the amount of the etching solution brought into contact with the copper foil surface (reducing spray pressure in the case of spray etching) while maintaining uniformity of the contact over the surface, or by a suitable combination thereof.

Thus, in this invention, a predetermined etching rate is selected from the range of from 0.01 to 0.3 $\mu$m/sec, preferably from 0.03 to 0.20 $\mu$m/sec, more preferably from 0.05 to 0.11 $\mu$m/sec. If the etching rate is higher than 0.3 $\mu$m/sec, not only the difference between the thickness of the resulting etched copper foil and a desired thickness is disadvantageously apt to become large because the progress of the etching is greatly affected by a little difference in etching time, but also it becomes difficult to obtain an etched copper foil having a thickness variation within $\pm 2.0$ $\mu$m, preferably $\pm 1.0$ $\mu$m, on the basis of a desired thickness because the thickness fluctuations over the etched surface are apt to become large. On the other hand, if the etching rate is less than 0.01 $\mu$m/sec, the etching requires too much time and such is not practical.

A preferred method of keeping the etching rate low is to keep the etching temperature low, or to keep the concentrations of etching agents in the etching solution low, or to combine these elements.

For example, the following etching solutions each having specific etching agent concentrations may be employed in order to attain the low etching rate. In the case of an etching solution containing hydrogen peroxide and sulfuric acid, the hydrogen peroxide concentration is in the range of from 1.5 to 4 w/v %, the sulfuric acid concentration from 3 to 7 w/v %, and the copper concentration from 10 to 60 g/l, and the etching temperature is between 25° to 50° C.

It is preferred to add an additive such as a stabilizer for hydrogen peroxide, a dissolution accelerator for copper, etc to this hydrogen peroxide/sulfuric acid etching solution. Examples of such additives include monohydric alcohols such as methanol, ethanol, propanol and butanol; dihydric alcohols such as ethylene glycol, propylene glycol, butanediol and pentanediol; trihydric alcohols or other polyhydric alcohols such as glycerin and pentaerythritol; glycol ethers such as polyethylene glycol; and nitrogen-containing organocyclic compounds such as aminobenzoic acid, aminotetrazole and phenylurea. The amount of such additives used may generally be suitably selected from the range of from 0.1 to 5%.

In the case of an etching solution containing cupric chloride, employed is, for example, an aqueous solution having a cupric chloride concentration of from 0.25 to 3 mol/l, preferably from 0.5 to 2 mol/l, and a hydrogen chloride concentration of from 1 to 4 mol/l, preferably from 2 to 3.6 mol/l, and etching is performed at a temperature, for example, between 25° to 55° C. If the cupric chloride concentration exceeds 3 mol/l, the solubility of cupric chloride becomes insufficient, while if the concentration is less than 0.25 mol/l, the etching rate disadvantageously becomes very low. On the other hand, if the hydrogen chloride concentration exceeds 4 mol/l, the etching rate becomes too high, which greatly affects the cupric chloride concentration (it becomes low because cupric chloride is consumed on the copper foil surface being etched) and, further, temperature dependence of the etching rate is enhanced, whereby good etching is difficult to perform. If the hydrogen chloride concentration is less than 1 mol/l, the etching rate becomes insufficiently low.

In the case of a so-called "alkali etching solution" containing $NH_4OH$, $NH_4Cl$, Cu, $NaClO_2$, $NH_4NO_3$, etc., there may be employed, for example, a method in which the concentration of $NH_4OH$ is about 3 mol/l or lower, $NaClO_2$ about 10 mol/l or lower, $NH_4Cl$ about 1 mol/l or lower, $NH_4HCO_3$ about 1 mol/l or lower, $NH_4NO_3$ about 1 mol/l or lower, and Cu 10 lb/gal (74.89 g/l) or lower, and the etching temperature is kept between 30° to 45° C., or a method in which the concentration of each etching agent is kept in a normal concentration, and the etching temperature is kept between about 20° to 30° C.

In the case of a persulfate etching solution containing $(NH_4)_2S_2O_8$ as a main etching agent, there may be employed, for example, a method in which the concentration of $(NH_4)_2S_2O_8$ is about 2 lb/gal (240 g/l) or lower, and the etching temperature is kept between 20° to 35° C.

In the case of an etching solution containing ferric chloride as a main etching agent, there may be mentioned, for example, a method in which an etching solution prepared by adding 35% HCl to ferric chloride solution of 40° Be so as to give a 35% HCl concentration of 20 to 1 vol %, or a solution prepared by diluting this etching solution with water is used, and etching is performed at 20° to 35° C.

In the case of an etching solution containing chromic acid and sulfuric acid, there may be mentioned, for example, a method in which an etching solution having a $CrO_3$ concentration of about 230 g/l or less, $Na_2SO_4$ about 40.5 g/l or less, and $H_2SO_4$ (96%) about 180 g/l or less is used.

However, the alkali etching solution has a disadvantage that the stability thereof is poor; the persulfate etching solution has a disadvantage that copper which has dissolved in the etching solution by etching is apt to separate out; the ferric chloride etching solution has a disadvantage that the etching rate greatly varies depending upon the concentration of dissolved copper; and the chromic acid/sulfuric acid etching solution has a disadvantage that the solution attacks the resin of a copper clad laminate. Therefore, most preferred in this invention is the hydrogen peroxide/sulfuric acid etching solution from the standpoints of management of etching solutions, environmental pollution, the state of finished copper foil surfaces, etc. In the case where the etching solution which has been used for etching is not required to store or the finished copper foil is not required to have a gloss surface, the cupric chloride etching solution is also preferably employed. Further, after the cupric chloride etching, it is also preferred to conduct the hydrogen peroxide/sulfuric acid etching as the finishing.

[Etching Apparatus]

In this invention, the method for etching is not particularly limited so long as etching can be performed at a predetermined etching rate selected from the range described hereinbefore, and spray etching, dipping, a method in which substrates to be etched are moved in an etching bath, and other various methods can be used.

At present, however, the conventional spray etching method is suitably employed. The spray etching is preferably conducted such that substrates to be etched is held horizontal or vertical, and immediately after the etching (immediately after the spraying), the etching solution remaining on the substrates is removed.

In order to obtain a copper foil having a desired thickness through etching with a certain etching solution, a method is employed, wherein the etching rate for the etching solution is measured beforehand under predetermined conditions, to set an etching time, and further the etching solution is managed so that this etching rate can be maintained. For example, in order to perform etching on a double-side copper-clad substrate having the same thicknesses of the copper foils on both sides thereof with the substrate being held horizontal, thereby to reduce the thicknesses of the both copper foils to the same thickness at a time, a method is employed, wherein spray pressure etc. are controlled so as to maintain the same etching rate on both upper and lower surfaces, and the etching is performed for a predetermined period of time.

Further, conventional etching machines are designed to have spray nozzles facing at right angles as much as possible to the copper surfaces of laminates traveling usually at a constant speed not exceeding a few meters per minutes, whereas in this invention the angles of spray nozzles are not especially limited so long as the copper foil surfaces of copper-clad substrates are uniformly sprayed, and the spray nozzles may even be positioned to have angles of 30° to 50° with respect to the copper foil surfaces.

In order to obtain, from a double-side copper-clad substrate, an etched substrate with the two copper foils having different thicknesses by means of a spray-type etching machine, a method is employed, wherein the etching rates for both sides are set and kept at respective desired values, with each etching rate being within the range as described hereinbefore, by using an etching solution having predetermined concentrations and controlling the spray pressure and the number of spray nozzles. However, preferred is a method in which the number of spray nozzles positioned in parallel with the traveling direction of the double-side copper-clad circuit board substrate to be etched is varied on each side.

In the case of horizontal spray etching, it is preferred to make the number of spray nozzles on the lower side smaller than that for the upper side, thereby to control the etching rates. For example, in the case where etching is performed using a spray etching machine equipped with 36 spray nozzles over an area of 1 m in length and 0.6 m in width on each of the upper and lower sides, the 36 nozzles on each side being normally positioned in 9 rows in the direction of the length (the direction parallel to the direction of travel) and in 4 rows in the direction of the width (the direction perpendicular to the direction of travel), and the ratio of the etching rate for the upper side to that for the lower side is set at 4/3, then the arrangement of the upper spray nozzles is not modified and the number of the lower spray nozzles is changed to 24 by reducing the number of rows in the direction of the length to 6 and leaving the number of rows in the direction of the width unchanged at 4, and thereafter the etching rate ratio is strictly controlled by controlling spray pressure, etc.

Alternatively, the following method can be employed: a method in which a substrate having provided on one side thereof an electrodeposited copper foil of, for example, 35 $\mu$m in thickness and on the other side an electrodeposited copper foil of, for example, 18 $\mu$m in thickness is used as a double-side copper-clad circuit board substrate, and both surfaces are etched at the same etching rate; a method in which a circuit board substrate having provided on both sides thereof an electrodeposited copper foil of 18 $\mu$m in thickness is used, with the whole surface of one side or, particularly, the part round the edge of one surface being covered with a release protective film such as a plastic film, and only the other uncovered surface is etched; and a method in which a double-side copper-clad circuit board substrate is subjected to etching, with the substrate being held vertical.

In order that the copper foil on one side can be completely removed and on the other side can be reduced in thickness to give a thin copper foil of desired thickness, by means of a spray etching machine, the same method as the above-described method for obtaining an etched substrate with both copper foils having different thicknesses is employed, except that the etching rate for the side where the copper foil is to be completely removed is set at a value higher than that in the above-described method. Specifically, in the case where horizontal spray etching is performed using a spray etching machine equipped with 54 spray nozzles over an area of 1 m in length and 0.6 m in width on each of the upper and lower sides, the 54 nozzles on each side being normally positioned in 9 rows in the direction of the length (the direction parallel to the direction of travel) and in 6 rows in the direction of the width (the direction perpendicular to the direction of travel), and the ratio of the etching rate for the upper side to that for the lower side is set at 2/1, then the arrangement of the upper spray nozzles is not modified and the number of the lower spray nozzles is made small by reducing the number of rows in the direction of the length to 4, and thereafter the etching rate ratio is controlled to obtain the desired value by controlling spray pressure, etc.

[Etching Operation]

Using the above-described copper-etching solution and etching apparatus, etching is performed at a specific etching rate as described hereinbefore.

In this invention, not only the etching rate selected from the range given hereinbefore is very low as compared with the etching rates employed in conventional processes for preparing printed circuit boards, but also it is essential that variation in the etching rate should be kept as smaller as possible. If the etching rate varies greatly as in conventional etching processes, it becomes impossible to obtain an etched copper foil having a thickness variation on the basis of a desired thickness within $\pm 2.0$ $\mu$m. Generally, the etching rate variation should be regulated within $\pm 10\%$, preferably within $\pm 5\%$, depending upon the amount of copper foils to be etched. This can be attained by regulating the concentration of each component in an etching solution, the etching temperature, the amount of the etching solution sprayed (contact time), etc.

For maintaining a predetermined etching rate, most important are: the regulation of an etching solution, i.e., strictly maintaining the concentrations of the components in the etching solution which greatly affect the etching rate; temperature regulation, i.e., maintaining a constant etching temperature; and time regulation, i.e., keeping an actual etching time constant.

The regulation of an etching solution is done by maintaining the concentration of an etching agent part of which has been consumed by the etching or of an etching agent part of which has been decomposed without contributing to the etching, generally within ±10%, preferably within ±3%, on the basis of a predetermined value. For accomplishing this regulation, the following methods can be employed: a method in which part of the etching solution is taken out and an etching solution having a predetermined concentration is added to the remaining etching solution; a method in which part of the etching solution is taken out and each of the necessary etching agents is separately added to the remaining etching solution; and a method in which part of the etching solution is taken out, subsequently copper components dissolved therein are separated, and then each of the necessary etching agents is added, in an amount in proportion thereto, to the remaining etching solution.

For example, in the case of a hydrogen peroxide/sulfuric acid etching solution, the method which comprises taking out part of the etching solution, and adding an etching solution having a predetermined concentration to the remaining etching solution is preferred because of its simplicity. In the case of a cupric chloride etching solution, preferred is a method in which part of the etching solution is taken out, then mainly the hydrogen chloride which has been consumed is supplemented to maintain the hydrogen chloride concentration and, further, part of the cuprous chloride which has been formed through etching is recycled after being regenerated by electrolytic regeneration or with an oxidizing agent such as hydrogen peroxide.

Temperature regulation is important because the present invention cannot be practiced if the etching temperature is substantially unregulated as in the conventional processes. Generally, the etching temperature is regulated within ±5° C., preferably ±2° C., more preferably ±1° C., on the basis of a predetermined temperature. For example, in the case of a hydrogen peroxide/sulfuric acid etching solution, since the temperature dependence of the etching rate is substantially the same as that with normal concentrations and, hence, the etching temperature is generally kept low as compared with the conventional processes, it is necessary to effectively cool the etching solution, as compared with the conventional processes, by employing a powerful means for cooling such as a refrigerant for lower temperatures or a larger-sized heat exchanger. In the case where a cupric chloride etching solution is used and, especially, the hydrogen chloride concentration is within the preferred range as described hereinbefore, then etching can be performed at a high temperature (around 50° C.), because the temperature dependency of the etching rate is low, and hence the temperature can be easily regulated.

For the time regulation, it is essential that the etching solution adhered on the etched copper foil surfaces should be removed more promptly, as well as the spray time or immersion time is regulated within ±3% on the basis of a predetermined time. For example, in the case of spray etching, the variation of the operating speed of the conveyor for transferring substrates is made small, and at least one roller for removing the etching solution remaining on copper foil surfaces is installed. Further, the etching is stopped without delay, and thereafter the etched substrates are immediately subjected to a post-treatment such as washing, neutralization, etc.

Moreover, another factor which affects the etching rate is a sway of laminates caused by spray pressure when thin laminates are etched by spray etching. Since such sway often prevents uniform contact of the etching solution with the copper foil surfaces, rollers or others are suitably installed as a support for the laminates.

Etching operations are as described above, but with respect to the management of etching solutions, it is required to grasp the concentration of each component in a real time. However, precision analysis for keeping the concentrations of respective components within the ranges described hereinbefore has a defect of taking time to give results, and this often leads to delay in regulating the concentrations. Although this problem may be solved by increasing the amount of the etching solution used to slow down the change in concentration, it is preferred to employ, in combination therewith, a method in which copper plates, small-sized laminates, or small-sized laminates having provided thereon a copper foil having a thickness equal to a desired etching thickness, for example, are suitably fed to the etching area so that the thickness which has been actually removed by the etching can be more promptly measured, and the concentrations of respective components in the etching solution are regulated on the basis on the results.

[Post-treatments of Thin Copper-Clad Substrate]

After the etching that the surface layer of a copper foil was removed in a predetermined thickness according to the method as described above, the surface of the resulting copper foil-clad circuit board substrate is usually cleaned, and then coated with an anti-corrosive agent or covered with a strippable resin coating, for the protection of the copper foil surface.

For the cleaning, known methods of removing impurities are employed such as cleaning with acid, neutralization, washing with water, and washing with hot water. A suitable cleaning method is selected taking into consideration the kind of the copper etching solution used and auxiliary additives contained therein such as a stabilizer and others. Generally, it is preferred that the copper surface be first washed with water or hot water, subjected to pickling with a diluted $H_2SO_4$ aqueous solution, subjected to the neutralization treatment with 1 to 5 wt % aqueous solution of sodium carbonate at 20° to 50° C., and then treated with an anti-corrosive agent by immersing the copper surface at 20 to 50° C. in an aqueous solution containing a known anti-corrosive agent, for example, an azole compound such as benzotriazole, at a concentration of 0.01 to 1 wt % and, further, suitably containing a surfactant or the like.

After the anti-corrosive treatment or in place of the anti-corrosive treatment, it is preferred to employ a method in which a film or photoresist film made of a strippable resin such as polyethylene, polypropylene, an ethylene-propylene resin, an ethylene-vinyl acetate resin, a vinylidene chloride resin, a polyacrylate copolymer, a 1,2-polybutadiene resin, a polyester resin, or other thermoplastic resins is press-bonded to the copper foil surface; or a method in which the copper foil surface is covered with a resin soluble in general-purpose solvents, such as paraffin wax, polyethylene wax, rosin and low molecular weight polystyrene, or with a photoresist resin syrup.

In this invention, unlike the hydrogen peroxide/sulfuric acid etching solution for copper, the cupric chloride etching solution for copper, for example, usually produces copper foils with lusterless surfaces. Hence, it is preferred at present that the copper-clad circuit board substrates produced using this etching solution be successively subjected again to etching after being suitably neutralized, cleaned, dried or otherwise treated.

With respect to the edge-bonded combined substrate which has been suitably treated after etching, as explained above, the edge part is cut off and the copper-clad substrate on each side is separated from the release sheet, thereby to obtain single-side thin copper foil-clad circuit board substrates. However, in the case where the single-side thin copper foil-clad circuit board substrate is intended to use as a thin outer layer in the preparation of multi-layer board by particularly pin lamination, or by other methods, it is preferred to perform perforating operation on the combined substrate, before its edge part is cut off and the copper-clad substrate on each side is separated from the release sheet.

As explained above and as will be clearly shown by Examples and Comparative Examples given below, the conventional alkali etching method or the like results in copper foils having a thickness variation which is so large as to be almost comparable to the thickness removed by the etching, whereas according to the method of the present invention, thin copper foil-clad substrates in which the copper foils have an extremely small thickness variation comparable to that of conventional extremely thin copper foils can easily be produced.

Therefore, thin copper foil-clad laminates which have so far been able to be produced only by a method employing a copper foil of, for example, 5 μm or 9 μm formed on a support such as an expensive aluminum foil, an electroless plating, a vapor deposition, or the like, can be easily prepared at low cost with good accuracy by the method of this invention. Hence, the industrial effect brought about by the present invention is extremely significant.

This invention will be illustrated in more detail by reference to the following Examples and Comparative Examples, which should not be construed to be limiting the scope of the invention.

In those examples, measurements of the thicknesses of copper foils after etching were made by an eddy current method employing an eddy-current film thickness meter (Dermess eddy-current film thickness meter, Type DS-1, manufactured by Elec Fine Instruments Company Limited, Japan).

EXAMPLE 1

Using 100 glass cloth-reinforced epoxy resin laminates each having a size of 700×1020 mm and a thickness of 1.6 mm and having provided on both sides thereof a copper foil having an average thickness of 15 μm and one side of which had been subjected to a low-profile treatment, thin copper-clad circuit board substrates having an average copper foil thickness of 9 μm were prepared as follows.

The double-side copper-clad laminates used had an average copper foil thickness of 15.0 μm, a maximum thickness of 15.5 μm, and a minimum thickness of 14.5 μm, thus the thickness variation being ±0.5 μm, and the surface roughnesses of the copper foils as measured by mean of a surface roughness tester were 3.6 to 4.3 μm.

Etching was performed using a horizontal etching machine under the following conditions.

| Etching Solution: | |
|---|---|
| $H_2O_2$ concentration; | 2.1 to 2.4 w/v % |
| $H_2SO_4$ concentration; | 3.6 to 4.1 w/v % |
| n-Propanol concentration; | 2 to 4 w/v % |
| Copper concentration; | 15 to 20 g/l |
| Etching conditions: | |
| Effective etching chamber length: | 2.0 m |
| Temperature; | 35 ± 1° C. |
| Spray pressure; | |
| upper side | 1.0 kg/cm² |
| lower side | 1.3 kg/cm² |
| Etching time; | 67 seconds |
| (conveyor speed; 1.8 m/min) | |
| Etching rate; | 0.09 μm/sec |

Subsequently, the resulting laminates were immersed in a 5% aqueous solution of $Na_2CO_3$ at room temperature for 30 seconds, and then in a 0.3% aqueous solution of benzotriazole at 40° C. for 30 seconds, and dried in hot air of 100° C. for 30 seconds.

With respect to all the thus-obtained 100 thin copper-clad laminates, the thicknesses of the copper foils were measured as follows.

Each of the thin copper-clad laminates was trisected in the directions of both length and width, giving 18 rectangular copper foil surfaces. On each of the rectangles, the thickness of the copper foil was measured at an arbitrary site. As a result, it was found that the copper foils had an average thickness of 8.9 μm, a maximum of 9.5 μm, and a minimum of 8.6 μm, thus the thickness variation on the basis of the average thickness being ±0.6 μm and that on the basis of the desired thickness being ±0.5 μm. Further, 95% of the measured values were within the range of from 8.6 to 9.4 μm, and the surface roughnesses of the copper foils were 2.0 to 3.0 μm.

Moreover, the thin copper foil-clad laminates obtained were allowed to stand at 25° C. under 60% RH for 30 hours, and then the appearances thereof were examined. As a result, no corrosion and no other changes were observed.

EXAMPLE 2

Using 10 laminates, thin copper-clad circuit board substrates having an average copper foil thickness of 9 μm were prepared in the same manner as in Example 1 except that a cupric chloride etching solution as specific below was used as a copper etching solution and the etching conditions were changed as follows.

Etching was performed using a horizontal etching machine under the following conditions.

| Etching Solution: | |
|---|---|
| $CuCl_2$ concentration: | |
| Initial | 2 mol/l |
| Finish | 1.5 mol/l |
| HCl concentration; | 3.3 ± 0.3 mol/l |
| Etching conditions: | |
| Effective etching chamber length; | 2.0 m |
| Temperature; | 50 to 55° C. |
| Spray pressure; | |
| Upper side | 1.0 kg/cm² |
| Lower side | 1.3 kg/cm² |
| Etching time; | 67 seconds |
| (conveyor speed; 1.8 m/min) | |
| Etching rate; | 0.09 μm/sec |

Subsequently, the resulting laminates were immersed in a 5% aqueous solution of Na$_2$CO$_3$ at room temperature for 30 seconds, and then in a 0.3% aqueous solution of benzotriazol at 40° C. for 30 seconds, and dried in hot air of 100° C. for 30 seconds.

With respect to all the thus-obtained thin copper-clad laminates, the thicknesses of the copper foils were measured as follows Each of the thin copper-clad laminates was trisected in the directions of both length and width, giving 18 rectangular copper foil surfaces. On each of the rectangles, the thickness of the copper foil was measured at an arbitrary site. As a result, it was found that the copper foils had an average thickness of 8.9 μm, a maximum of 9.4 μm, and a minimum of 8.6 μm, thus the thickness variation on the basis of the average thickness being ±0.5 μm and that on the basis of the desired thickness being ±0.4 μm.

Further, the thin copper foil-clad laminates obtained were allowed to stand at 25° C. under 60% RH. As a result, spots of corrosion were developed in 5 hours, showing slightly insufficient storage stability.

COMPARATIVE EXAMPLE 1

In obtaining 9 μm thin copper-clad circuit board substrates, the same copper-clad laminates as used in Example 1 were subjected to etching with an ordinarily-employed cupric chloride etching solution as specified below.

| Etching solution (aqueous solution containing the following components): | |
|---|---|
| CuCl$_2$.2H$_2$O concentration; | 170 g/l (=1.0 mol/l) |
| HCl (20° Be) concentration; | 0.6 l/l (=6.6 mol/l) |
| Copper concentration; | 4 ounce/gallon or lower |

First, the etching rate for this etching solution was measured using a copper foil-clad laminate having a copper foil thickness of 70 μm under the following conditions.

| Etching conditions: | |
|---|---|
| Effective etching chamber length; | 2.0 m |
| Temperature; | 50 ± 1° C. |
| Spray pressure: | |
| upper side | 1.0 kg/cm$^2$ |
| lower side | 1.3 kg/cm$^2$ |

As a result, it was found that the etching rate was 0.5 μm/sec. Hence, in the case of the copper foil-clad laminate with a copper foil thickness of 15 μm, the etching time required for reducing the copper thickness by 6 μm through etching to attain an average thickness of 9.0 μm was found to be 12 seconds.

Therefore, it was necessary to increase the conveyor speed of the etching machine used in Example 1 to 10 m/min. However, this etching machine could not be operated at such a high speed and, hence, an alternative method was employed with this etching machine. That is, of all the spray nozzles positioned over the effective etching chamber length of 2.0 m, those covering 1.5 m of the 2 m were closed, and the conveyor speed was set at 2.5 m/min. Under these conditions, 5 double-side copper-clad laminates which were the same as those used in Example 1 were subjected to etching.

With respect to each of the thus-obtained 5 thin copper-clad laminates, the thickness of the copper foil was measured in the same manner as in Example 1. As a result, it was found that the copper foils had an average thickness of 8.7 μm, a maximum of 10.6 μm, and a minimum of 5.2 μm, thus the thickness variation on the basis of the average thickness being ±3.5 μm and that on the basis of the desired thickness being ±4.8 μm. Further, 48% of the measured values were within the range of from 8.5 to 9.5 μm, and the surface roughnesses of the copper foils were 3.8 to 4.5 μm. Moreover, the thin copper foil-clad laminates obtained were allowed to stand at 25° C. under 60% RH. As a result, spots of corrosion were developed in 3 hours.

EXAMPLE 3

Double-side copper-clad laminates having an average copper foil thickness of 12 μm were prepared in the same manner as in Example 1 except that etching conditions were set as follows.

| Etching solution: | |
|---|---|
| H$_2$O$_2$ concentration; | 1.7 to 2.0 w/v % |
| H$_2$SO$_4$ concentration; | 3.6 to 4.1 w/v % |
| n-Propanol concentration; | 2 to 4 w/v % |
| Copper concentration; | 15 to 20 g/l |
| Etching conditions; | |
| Effective etching chamber length; | 2.0 m |
| Temperature; | 35 ± 1° C. |
| Spray pressure; | |
| Upper side | 1.0 kg/cm$^2$ |
| Lower side | 1.3 kg/cm$^2$ |
| Etching time; | 40 seconds |
| (conveyor speed; 3.0 m/min) | |
| Etching rate; | 0.075 μm/sec |

The thicknesses of the thin copper foil-clad laminates thus obtained were measured. As a result, it was found that the copper foils had an average thickness of 12.1 μm, a maximum of 12.6 μm, and a minimum of 11.6 μm, thus the thickness variation on the basis of the average thickness being ±0.5 μm and that on the basis of the desired thickness being ±0.6 μm.

Further, the surface roughnesses of the copper foils were 3.1 to 3.6 μm.

EXAMPLE 4

In order to obtain thin copper-clad laminates having a copper foil thickness of 5 μm, the same procedures as in Example 1 were repeated except that laminates having provided on both sides thereof a copper foil which had an average thickness of 12 μm and one side of which had been subjected to a low-profile treatment were used as double-side copper-clad laminates and the conveyor speed of the etching machine was set at 1.5 m/min.

The double-side copper-clad laminates employed had an average copper foil thickness of 12.0 μm, a maximum of 12.4 μm, and a minimum of 11.6 μm, thus the thickness variation being ±0.4 μm, and the surface roughnesses of the copper foils were 4.2 to 5.1 μm.

After the etching and post-treatments, the thicknesses of the thin copper foil-clad laminates obtained were measured. As a result, it was found that the copper foils had an average thickness of 4.7 μm, a maximum of 5.4 μm, and a minimum of 4.0 μm, thus the thickness variation on the basis of the average thickness being ±0.7 μm and that on the basis of the desired thickness being ±1.0 μm.

Further, the surface roughnesses of the copper foils were 2.3 to 3.3 μm.

EXAMPLE 5

Using a horizontal spray etching machine, 1020×1020 mm glass cloth-reinforced epoxy resin laminates each having a thickness of 1.6 mm and having provided on both sides thereof a copper foil (TC foil, manufactured by Nikko Gould Foil Co., Ltd., Japan) having a nominal thickness of 18 μm were subjected to etching with an etching solution prepared by diluting three times a hydrogen peroxide/sulfuric acid etching solution, FES-6000 (manufactured by Mitsubishi Gas Chemical Company, Inc., Japan; $H_2O_2$=7.78 w/v %, $H_2SO_4$=11.7 w/v %). Etching conditions were as follows.

| Etching conditions: | |
|---|---|
| Temperature; | 30° C. |
| Spray pressure; | |
| Upper side | 1.5 kg/cm² |
| Lower side | 1.3 kg/cm² |
| Cu concentration; | 40 g/l |
| Etching rate; | 0.18 μm/sec |

Subsequently, the resulting laminates were washed with acid, neutralized and then washed with water. Thereafter, the resulting copper foil surfaces were treated with a water-soluble anti-corrosive agent (for example, C. B. Bright, manufactured by Mitsubishi Gas Chemical Company, Inc., Japan; Corromin CB manufactured by Kao-Atlas Co., Ltd. Japan; etc.) to perform corrosion-preventing treatment, and then the thicknesses of the resulting copper foils were measured. A total of 10 thin copper-clad laminates were continuously prepared. The results are shown in Table 1.

COMPARATIVE EXAMPLE 2

The same procedures as in Example 5 were repeated except that, as an etching solution, FES-6000 was used without being diluted and etching conditions were set as follows. Results obtained are shown in Table 1.

| Etching conditions: | |
|---|---|
| Temperature; | 50° C. |
| Spray pressure; | |
| Upper side | 1.5 kg/cm² |
| Lower side | 1.0 kg/cm² |
| Cu concentration | 40 g/l |
| Etching rate; | 0.63 μm/sec |

TABLE 1

| | Original laminate | Example 5 | Comparative Example 2 |
|---|---|---|---|
| Thickness of copper foil (μm) | | | |
| Upper side | | | |
| Average of 10 | 21 | 8.8 | 8.9 |
| Min. | — | 8.2 | 7.9 |
| Max. | — | 9.2 | 9.6 |
| Lower side | | | |
| Average of 10 | 21 | 8.8 | 9.0 |
| Min. | — | 8.3 | 7.9 |
| Max. | — | 9.4 | 9.9 |
| Peel strength of copper foil (kg/cm) | | 1.0 | 1.0 |

COMPARATIVE EXAMPLE 3

In order to prepare 10 double-side copper-clad laminates which were the same as those obtained in Example 5, lamination molding was performed using electrolytic copper foils each of which had a nominal thickness of 9 μm and one side of each of which had been subjected to a treatment for adhesion, at 170° C. for 2 hours under a pressure of 40 kg/cm². It was extremely difficult to handle the 9 μm thick copper foils without causing wrinkles, and 30% of the lamination-molded products had wrinkles. The thus-obtained 10 double-side copper-clad laminates had an average copper foil thickness of 11.9 μm, a minimum of 11.6 μm, and a maximum of 12.6 μm, and the peel strength of these copper foils was 0.85 kg/cm.

COMPARATIVE EXAMPLE 4

Using a foil which had been prepared by plating a 40 μm thick aluminum foil with copper of 9 μm in thickness (nominal) and then roughening the surface of the copper, the same procedures as in Comparative Example 3 were repeated, thereby preparing 10 double-side metal-clad laminates. Thereafter, the aluminum foils were removed by etching. The thus-obtained 10 double-side copper-clad laminates had an average copper foil thickness of 8.8 μm, a minimum of 8.1 μm, and a maximum of 9.3 μm, and the peel strength of these copper foils was 0.85 kg/cm.

EXAMPLE 6

Using a horizontal spray etching machine, 10 double-side thin copper-clad laminates were prepared in the same manner as in Example 5 except that the size of the double-side copper-clad laminates was 400×300 mm, the etching solution used was a ferric chloride etching solution ($FeCl_3$ 5.8 liter; 35% HCl 1.2 liter; water 3.0 liter), and etching was performed at 25° C., with an etching speed being 0.25 μm/sec, a spray pressure for upper side being 1.0 kg/cm², and that for lower side being 0.8 kg/cm². The thus-obtained 10 thin copper-clad laminates had an average copper foil thickness of 9.0 μm, the thicknesses being in the range of from 8.1 to 9.9 μm.

EXAMPLE 7

Using a horizontal spray etching machine, 600×1000 mm glass cloth-reinforced epoxy resin laminates each having a thickness of 1.6 mm and having provided on both sides thereof a copper foil (TC foil, manufactured by Nikko Gould Foil Co., Ltd., Japan) having a nominal thickness of 18 μm were subjected to etching with an etching solution prepared by diluting three times a hydrogen peroxide/sulfuric acid etching solution, FES-6000 (manufactured by Mitsubishi Gas Chemical Company, Inc., Japan; $H_2O_2$=7.78 w/v %, $H_2SO_4$=11.7 w/v %). Etching conditions were as follows.

| Etching conditions: | |
|---|---|
| Etching chamber of the etching machine; | |
| length | 1 m |
| width | 0.6 m |
| Arrangement of spray nozzles; | |
| Standard; | |
| direction of length | 9 rows |
| direction of width | 4 rows |
| Actual; | |
| upper side - standard | |
| lower side - the 2nd, 5th and 8th rows in the direction of length were closed. | |

-continued

| Spray pressure; | |
|---|---|
| upper side | 1.5 kg/cm$^2$ |
| lower side | 1.3 kg/cm$^2$ |
| Temperature; | 30° C. |
| Cu concentration; | 40 g/l |
| Etching rate in standard arrangement; | 0.18 μm/sec |

Subsequently, the resulting laminates were washed with acid, neutralized and then washed with water. Thereafter, the resulting copper foil surfaces were treated with a water-soluble anti-corrosive agent (for example, C. B. Bright, manufactured by Mitsubishi Gas Chemical Company, Inc., Japan; Corromin CB, manufactured by Kao-Atlas Co., Ltd. Japan; etc.) to perform corrosion-preventing treatment, and then the thicknesses of the resulting copper foils were measured by an eddy-current film thickness meter (Dermess eddy-current film thickness meter, Type DS-1, manufactured by Elec Fine Instruments Company Limited, Japan). A total of 10 thin copper-clad laminates each having thin copper foils of different thicknesses were continuously prepared. The results are shown in Table 2.

EXAMPLE 8

Using the same etching machine as that used in Example 6, 600×1000 mm glass cloth-reinforced epoxy resin laminates each having a thickness of 1.6 mm and having provided on one side thereof an electrolytic copper foil having a nominal thickness of 50 μm and on the other side thereof an electrolytic copper foil having a nominal thickness of 18 μm were subjected to etching under the same conditions as in Example 6 except that the arrangements of spray nozzles for both upper and lower sides were standard. Thereafter, the resulting laminates were likewise subjected to the corrosion-preventing treatment, and then the thicknesses of the resulting copper foils were measured. The results are shown in Table 2.

TABLE 2

| | Example 7 | Example 2 |
|---|---|---|
| Thickness of copper foil (μm) | | |
| Upper side | | |
| Average of 10 | 8.8 | 41.1 |
| Min. | 8.2 | 40.5 |
| Max. | 9.3 | 41.7 |
| Lower side | | |
| Average of 10 | 12.5 | 8.8 |
| Min. | 11.9 | 8.3 |
| Max. | 13.1 | 9.4 |
| Peel strength of copper foil (kg/cm) | | |
| Upper side | 1.0 | 2.2 |
| Lower side | 1.2 | 1.0 |

EXAMPLE 9

1020×1020 mm glass cloth-reinforced epoxy resin prepregs of 0.1 mm in thickness, 1050×1050 mm copper foils of 18 μm in nominal thickness (JTC-treated electrolytic copper foil, manufactured by Nikko Gould Foil Co., Ltd. Japan), and a Tedlar film (manufactured by E.I. du Pont de Nemours and Co.) were superposed in the order of: copper foil/prepreg/Tedlar film/prepreg/copper foil. The resulting assembly was then lamination-molded between two mirror plates at 170° C. under 30 kg/cm$^2$ for 2 hours, thereby preparing a "combined laminate" in which the single-side copper-clad laminates of 0.1 mm in thickness were provisionally bonded with each other through the film and united.

Using a horizontal spray etching machine, this combined laminate was subjected to etching with an etching solution prepared by diluting three times a hydrogen peroxide/sulfuric acid etching solution, FES-6000 (manufactured by Mitsubishi Gas Chemical Company, Inc., Japan; H$_2$O$_2$=7.78 w/v %, H$_2$SO$_4$=11.7 w/v %).
Etching conditions were as follows.

| Etching conditions: | |
|---|---|
| Spray pressure; | |
| Upper side | 1.5 kg/cm$^2$ |
| Lower side | 1.3 kg/cm$^2$ |
| Temperature; | 30° C. |
| Cu concentration; | 40 g/l |
| Etching rate in standard arrangement; | 0.18 μm/sec |

Subsequently, the resulting laminate was washed with acid, neutralized and then washed with water. Thereafter, the resulting upper foil surfaces were treated with a water-soluble anti-corrosive agent (for example, C. B. Bright, manufactured by Mitsubishi Gas Chemical Company, Inc., Japan; Corromin CB, manufactured by Kao-Atlas Co., Ltd., Japan; etc.) to perform corrosion-preventing treatment, and then dried.

Then, the edge of the resulting laminate was cut off to obtain a 1000×1000 mm combined laminate Thereafter, the copper-clad laminates were separated from the release film, thereby obtaining two single-side copper-clad laminates of 0.1 mm in thickness. The thicknesses of the copper foils of the thus-obtained two copper clad laminates were measured, and the results are shown in Table 3.

TABLE 3

| | Example 9 |
|---|---|
| Thickness of copper foil (μm) | |
| Upper side | |
| Average of 10 | 8.8 |
| Min. | 8.2 |
| Max. | 9.2 |
| Lower side | |
| Average of 10 | 8.8 |
| Min. | 8.3 |
| Max. | 9.4 |

EXAMPLE 10

A combined laminate was prepared in the same manner as in Example 9, and cut into 6 combined laminates each having a size of 500×330 mm by means of a shearing machine.

In the same manner as in Example 9, the thus-sized combined laminates was subjected to etching, washed, treated with anti-corrosive agent, and then dried. Thereafter, the copper-clad laminates were separated from the release films, thereby obtaining 12 single-side copper-clad laminates of 0.1 mm in thickness having an average copper foil thickness of 8.8 μm.

After the copper-clad laminates were separated from the release films, penetration of the etching solution, washing liquid, or anti-corrosive liquid into the edges of the combined laminates was examined. As a result, no penetration was observed.

EXAMPLE 11

A polypropylene film of 30 μm in thickness was superposed between two copper foils (manufactured by Mitsui Mining & Smelting Co., Ltd., Japan) each having a nominal thickness of 18 μm and also having on one side a 40 μm thick adhesive coating, with the copper foils being outside. Subsequently, the resulting assembly was heat-pressed for 2 seconds by means of heat rollers of 140° C., thereby preparing a combined sheet in which the copper foils were provisionally bonded with each other through the film.

Using this provisionally bonded combined sheet, and post-treatments were performed in the same manner as in the Example 5, thereby obtaining 8.8 μm thick copper foils having an adhesive coating.

EXAMPLE 12

1080×1080 mm electrolytic copper foils of 16 μm in thickness, one side of each of which had been subjected to a surface-roughening treatment, 1060×1060 mm woven glass cloth-reinforced epoxy resin prepregs of 0.1 mm in thickness, and a 1035×1035 mm Tedlar film of 25 μm in thickness as a release film were superposed in the order of: electrolytic copper foil/two prepregs/release film/two prepregs/electrolytic copper foil. This superposition was performed such that the release film was positioned in the center of the prepregs. In total, 6 assemblys each having the above constitution were formed, and each assembly was lamination-molded between mirror plates at 175° C. under 40 kg/cm² for 2 hours.

Subsequently, the edges of the resulting laminates were cut off to prepare 1055×1055 mm edge-bonded combined laminates. The thus-prepared edge-bonded combined laminates were transferred, together with ordinary copper-clad laminates, to a place about 400 km apart by means of a truck.

The edge-bonded combined laminates thus transferred were subjected to etching with a hydrogen peroxide/sulfuric acid etching solution by means of a horizontal spray etching machine, thereby to reduce the thicknesses of the copper foils by 9 μm on an average, and then washed. Immediately after that, the copper foil surfaces of the resulting combined laminates were treated with an anti-corrosive agent, and then dried. The hydrogen peroxide/sulfuric acid etching solution contained 0.8 mol/l $H_2O_2$, 0.55 mol/l $H_2SO_4$, and 50 g/l Cu. The etching conditions were as follows: etching temperature, 30° C.; etching time, 100 seconds; and spray pressure for both upper and lower sides, 1.6 kg/cm². Further, the corrosion-preventing treatment was performed by immersing the copper surfaces in a 0.3% aqueous solution of benzotriazol at 40° C. for 30 seconds, and then washing the surfaces with water.

Subsequently, with respect to each of the thus-obtained combined laminates, the edge part was cut off such that the area where a level difference was present was included in the edge part, thereby to prepare combined single-side thin copper foil-clad circuit board substrates each having a size of 1020×1020 mm. Thereafter, the single-side copper-clad substrates were separated from the release films.

No penetration into the layers of the release films of the etching solution or the liquid used in the corrosion-preventing treatment was observed, since the edges had been completely bonded.

The thicknesses of the copper foils of these single-side thin copper foil-clad circuit board substrates were all within the range of 7±0.6 μm.

EXAMPLE 13

Lamination molding was performed in the same manner as in Example 12 except that a perforated Tedlar film having a size of 1060×1060 mm and a thickness of 25 μm was used as a release film. The perforations each having a short diameter of 5 mm and a long diameter of 8 mm were positioned in 3 rows in the direction of the length (12, 530 and 1048 mm from the edge) and in 4 rows in the direction of the width (11, 357, 703 and 1049 mm from the edge), at intervals of 12 mm, with the perforations in each row being oriented such that the direction of the long diameter was parallel to the direction of the row.

Subsequently, the resulting laminate was cut at the center of the perforations of each row, thereby to obtain 6 edge-bonded combined laminates each having a size of about 515×345 mm. These laminates were transferred in the same manner as in Example 12.

The edge-bonded combined laminates thus transferred were subjected to etching in the same manner as in Example 9 except that an etching machine having a width of 600 mm was used. Then, the resulting laminates were washed, treated with an anti-corrosive agent, and then dried in the same manner as in Example 9. Thereafter, the edge of each of the resulting laminates were cut off, thereby preparing 6 combined laminates each having a size of 500×30 mm. The laminates were separated from the release films, thereby obtaining 12 single-side copper-clad laminates of 0.2 mm in thickness having an average copper foil thickness of 8.8 μm.

After the laminates were separated from the films, penetration into the edge parts of the etching solution, washing liquid and anti-corrosive liquid was examined. As a result, no penetration was observed.

While the invention has been described in detail and with reference to specific embodiments thereof, it will be apparent to one skilled in the art that various changes and modifications can be made therein without departing from the spirit and scope thereof.

What is claimed is:

1. A method for preparing a thin copper foil-clad substrate for the manufacture therefrom of circuit boards, which comprises subjecting a copper foil-clad circuit board substrate comprising an electrically insulating support having provided on one or both sides thereof a copper foil having an average thickness of 12 μm or more to etching with an etching solution for copper, said etching being performed such that the whole surface of the copper foil is etched at a predetermined etching rate selected from the range of from 0.01 to 0.3 μm/sec, thereby to reduce the thickness of the copper foil on at least one side of the insulating support to 10 to 80% of its original thickness, and the variation of the thickness of the copper foil remaining after the etching is within ±2.0 μm on the basis of a desired thickness.

2. A method as claimed in claim 1, wherein the variation of the thickness of the copper foil remaining after etching is within ±1.0 μm on the basis of a desired thickness.

3. A method as claimed in claim 1, wherein said etching solution for copper is an aqueous solution containing 1.5 to 4 w/v % hydrogen peroxide, 3 to 7 w/v % sulfuric acid, and 10 to 60 g/l copper, the concentrations of hydrogen peroxide and sulfuric acid being each regulated within ±0.3 w/v % on the basis of a predetermined concentration, and the etching is performed at a temperature of from 25° to 50° C., the temperature being regulated within ±1.0° C. on the basis of a predetermined temperature.

4. A method as claimed in claim 3, wherein said etching solution for copper further contains 0.1 to 5 w/v % alcohol as an auxiliary.

5. A method as claimed in claim 1, wherein said etching solution for copper is an aqueous solution containing 0.25 to 3 mol/l cupric chloride and 1 to 4 mol/l hydrogen chloride, at least the concentration of hydrogen chloride being regulated within ±0.3 mol/l on the basis of a predetermined concentration, and the etching is performed at a temperature of from 25° to 55° C., the temperature being regulated within ±5.0° C. on the basis of a predetermined temperature.

6. A method as claimed in claim 5, wherein after the etching, the whole surface of the copper foil is further etched with a hydrogen peroxide/sulfuric acid etching solution.

7. A method as claimed in claim 1, which further comprises cleaning the surface of the copper foil remaining after the etching, and then covering the cleaned surface with an anti-corrosive agent or a strippable resin coating, thereby protecting the copper surface.

8. A method as claimed in claim 7, wherein the cleaning is performed by treating, immediately after the etching, the surface of the remaining copper foil with a water-soluble anti-corrosive agent.

9. A method as claimed in claim 7, wherein said strippable resin coating is a photoresist.

10. A method as claimed in claim 1, wherein said copper foil-clad circuit board substrate is a double-side copper foil-clad circuit board substrate, and the etching is performed such that the thickness of the copper foil on at least one side of the insulating support is reduced to 3 to 15 μm, thereby to prepare a double-side thin copper foil-clad circuit board substrate in which each side of the insulating support has a copper foil adhered thereto, the two copper foils having different thicknesses.

11. A method as claimed in claim 10, wherein the etching of said double-side copper foil-clad circuit board substrate is performed by means of a spray-type etching machine, with its spray nozzles for spraying an etching solution being positioned on each side of said double-side copper foil-clad circuit board substrate, the number of said spray nozzles on one side of the substrate being different from that for the other side.

12. A method as claimed in claim 1, wherein said copper foil-clad circuit board substrate is a double-side copper foil-clad circuit board substrate, and the etching is performed such that the thickness of the copper foil on one side of the insulating support is reduced to 3 to 15 μm and the copper foil on the other side is completely removed.

13. A method as claimed in claim 1, wherein said copper foil-clad circuit board substrate is a combined substrate prepared by provisionally bonding two single-side copper-clad circuit board substrates with each other through a release plastic film, thereby to unite the two substrates into a prepreg.

14. A method as claimed in claim 13, wherein said single-side copper-clad circuit board substrates of said combined substrate each have thicknesses of 0.3 mm or less.

15. A method as claimed in claim 13, wherein said combined substrate is an edge-bonded combined substrate in which the edge thereof has been partly or wholly bonded.

16. A method as claimed in claim 15, wherein said edge-bonded combined substrate is prepared by forming a combined substrate using a release film or sheet having a predetermined area size smaller than the prepreg, a film or sheet having a releasable part of a predetermined area size, or a release film or sheet having many perforations in the part corresponding to the edge of the edge-bonded combined substrate to be formed, and then cutting the thus-formed combined substrate into a predetermined size.

* * * * *